(12) United States Patent
Wang et al.

(10) Patent No.: US 10,817,700 B2
(45) Date of Patent: Oct. 27, 2020

(54) OPTICAL FINGERPRINT RECOGNITION CHIP PACKAGE AND PACKAGING METHOD

(71) Applicant: China Wafer Level CSP Co., Ltd., Suzhou, Jiangsu (CN)

(72) Inventors: Zhiqi Wang, Jiangsu (CN); Guoliang Xie, Jiangsu (CN); Hanqing Hu, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 42 days.

(21) Appl. No.: 16/210,989

(22) Filed: Dec. 5, 2018

(65) Prior Publication Data
US 2019/0188447 A1 Jun. 20, 2019
US 2020/0234028 A9 Jul. 23, 2020

(30) Foreign Application Priority Data
Dec. 18, 2017 (CN) .......................... 2017 1 1364625
Dec. 18, 2017 (CN) ..................... 2017 2 1773041 U

(51) Int. Cl.
*G06K 9/00* (2006.01)
*H01L 27/146* (2006.01)

(52) U.S. Cl.
CPC ...... *G06K 9/00046* (2013.01); *H01L 27/1463* (2013.01); *H01L 27/14618* (2013.01);
(Continued)

(58) Field of Classification Search
None
See application file for complete search history.

(56) References Cited

U.S. PATENT DOCUMENTS

2015/0153224 A1 6/2015 Shibayama et al.
2016/0284751 A1 9/2016 Ho et al.

FOREIGN PATENT DOCUMENTS

CN 104078479 A * 10/2014
CN 104078479 A 10/2014
(Continued)

OTHER PUBLICATIONS

Office Action for Chinese Application No. 201711364625.6, dated Oct. 31, 2019.
(Continued)

Primary Examiner — Kenneth B Lee, Jr.
(74) Attorney, Agent, or Firm — Wolf, Greenfield & Sacks, P.C.

(57) ABSTRACT

An optical fingerprint recognition chip package and a packaging method are provided. In the optical fingerprint recognition chip package, a cover plate is arranged on a front surface of an optical fingerprint recognition chip, the cover plate includes a substrate and a light shielding layer. The light shielding layer is arranged on a surface of the substrate facing away from the optical fingerprint recognition chip. The substrate is provided with multiple first through holes for exposing photosensitive pixels of the optical fingerprint recognition chip. The light shielding layer is provided with multiple second through holes in one-to-one correspondence with the first through holes. During fingerprint recognition, light reflected by a finger is split through the first through holes and the second through holes, such that crosstalk among different photosensitive pixels is reduced, and the accuracy of fingerprint recognition is improved.

20 Claims, 10 Drawing Sheets

(52) U.S. Cl.
CPC .. *H01L 27/14623* (2013.01); *H01L 27/14625* (2013.01); *H01L 27/14687* (2013.01); *G06K 9/00053* (2013.01); *H01L 27/14678* (2013.01)

(56) References Cited

FOREIGN PATENT DOCUMENTS

| | | | |
|---|---|---|---|
| CN | 104303032 | A | 1/2015 |
| CN | 204230221 | U | 3/2015 |
| CN | 106206625 | A | 12/2016 |
| CN | 106503635 | | 3/2017 |
| CN | 106684052 | A | 5/2017 |
| CN | 107046008 | A * | 8/2017 |
| CN | 107046008 | A | 8/2017 |
| CN | 207651485 | U | 7/2018 |

OTHER PUBLICATIONS

Second Office Action for Chinese Application No. 201711364625.6, dated Jun. 18, 2020.

* cited by examiner

OPTICAL FINGERPRINT RECOGNITION CHIP PACKAGE AND PACKAGING METHOD

This application claims priorities to Chinese Patent Application No. 201711364625.6, titled "OPTICAL FINGERPRINT RECOGNITION CHIP PACKAGE AND PACKAGING METHOD", filed on Dec. 18, 2017 with the Chinese Patent Office, and Chinese Patent Application N. 201721773041.X, titled "OPTICAL FINGERPRINT RECOGNITION CHIP PACKAGE", filed on Dec. 18, 2017 with the Chinese Patent Office, which are incorporated herein by reference in their entireties.

FIELD

The present disclosure relates to the technical field of chip packaging, and in particular to an optical fingerprint recognition chip package and a packaging method for fabricating the optical fingerprint recognition chip package.

BACKGROUND

With the continuous development of science and technology, more and more electronic devices are widely used in and bring great convenience to people's daily life and work, and these electronic devices become indispensable important tools to people currently. With the continuous increase in the functions of electronic devices, electronic devices store more and more important information. The identification authentication technology for electronic devices becomes a major direction in development of electronic devices currently.

The fingerprint recognition technology is characterized by high safety, high reliability and simple operation because of uniqueness and invariability of human fingerprints. Therefore, the fingerprint recognition technology has become a mainstream technology for identification authentication in various electronic devices.

At present, the optical fingerprint recognition chip is commonly used in conventional electronic devices. The optical fingerprint recognition chip collects fingerprint information of a user through a great number of photosensitive pixels in the fingerprint recognition region, and each of the photosensitive pixels functions as a detection point. Specifically, during fingerprint recognition, light is irradiated to a fingerprint surface of the user and is reflected by the fingerprint surface to the photosensitive pixels. The photosensitive pixels convert light signals of the fingerprint into electrical signals, such that fingerprint information may be acquired based on the electrical signals converted by all the pixels.

In a case where a conventional optical fingerprint recognition chip is packaged, a transparent cover plate is directly arranged on the photosensitive surface. However, since the transparent cover plate is completely light-transmitting, crosstalk may be caused among different photosensitive pixels, such that the accuracy of fingerprint recognition can be affected.

SUMMARY

In order to solve the above problems, an optical fingerprint recognition chip package and a packaging method for fabricating the optical fingerprint recognition chip package are provided according to the technical solution of the present disclosure, to eliminate the crosstalk among different photosensitive pixels, such that accuracy of fingerprint recognition can be improved.

The following technical solutions are provided according to the present disclosure.

An optical fingerprint recognition chip package is provided, which includes an optical fingerprint recognition chip, and a cover plate.

The optical fingerprint recognition chip has a front surface and a back surface opposite to each other. The front surface includes a fingerprint recognition region and a peripheral region surrounding the fingerprint recognition region, the fingerprint recognition region is provided with multiple photosensitive pixels, and the peripheral region is provided with a contact pad electrically connected to the photosensitive pixels.

The cover plate is arranged opposite to the front surface of the optical fingerprint recognition chip and includes a substrate and a light shielding layer.

The light shielding layer is located on a side of the substrate facing away from the optical fingerprint recognition chip, the substrate is provided with multiple first through holes for exposing the photosensitive pixels, and the light shielding layer is provided with multiple second through holes in one-to-one correspondence with the multiple first through holes.

In an embodiment, in the above optical fingerprint recognition chip package, the cover plate is spaced from the optical fingerprint recognition chip by a preset interval, to adjust an image distance for pinhole imaging through the cover plate.

In an embodiment, in the above optical fingerprint recognition chip package, a glass filter is arranged between the cover plate and the optical fingerprint recognition chip, to remove light outside a detection light wave band.

In an embodiment, in the above optical fingerprint recognition chip package, a glass filter is arranged on a surface of the cover plate facing away from the optical fingerprint recognition chip, to remove light outside a detection light wave band.

In an embodiment, in the above optical fingerprint recognition chip package, a spacer with a preset thickness is arranged between a periphery of the cover plate and a periphery of the optical fingerprint recognition chip.

In an embodiment, in the above optical fingerprint recognition chip package, the substrate is provided with a first opening at a position corresponding to the contact pad, to expose the contact pad, the light shielding layer is provided with a second opening at a position corresponding to the first opening, to expose the first opening, and the contact pad is configured to be electrically connected to a metal wire through the first opening and the second opening, so as to be electrically connected to a pad of a backplane through the metal wire.

In an embodiment, in the above optical fingerprint recognition chip package, the first opening includes a first groove and a second groove located in the first groove, and the contact pad is exposed by the first groove and the second groove.

In an embodiment, in the above optical fingerprint recognition chip package, the optical fingerprint recognition chip is provided with a through silicon via at a position on the back surface corresponding to the contact pad, and the contact pad is exposed by the through silicon via, a sidewall of the through silicon via and the back surface of the optical fingerprint recognition chip are covered with an insulating layer, a surface of the insulating layer is covered with a rewiring layer, and the rewiring layer is electrically connected to the contact pad through the through silicon via and extends outside the through silicon via, and the rewiring layer is covered with a solder mask, the solder mask is provided with an opening in a region corresponding to the back surface of the optical fingerprint recognition chip, and the opening is configured to accommodate a solder bump for electrical connection to a pad of a backplane.

In an embodiment, in the above optical fingerprint recognition chip package, the substrate is a silicon substrate.

In an embodiment, in the above optical fingerprint recognition chip package, the light shielding layer is made of dry film photoresist or wet film photoresist.

In an embodiment, in the above optical fingerprint recognition chip package, a depth-to-width ratio of the first through hole is less than or equal to than 6:1.

In an embodiment, in the above optical fingerprint recognition chip package, depth-to-width ratio of the second through hole is less than or equal to 6:1.

In an embodiment, in the above optical fingerprint recognition chip package, a thickness of the substrate is less than or equal to 200 µm.

In an embodiment, in the above optical fingerprint recognition chip package, a thickness of the light shielding layer is less than or equal to 200 µm.

In an embodiment, in the above optical fingerprint recognition chip package, the substrate is attached to the optical fingerprint recognition chip by a die attach film (DAF).

In an embodiment, in the above optical fingerprint recognition chip package, the photosensitive pixels are arranged in an array, and the first through holes are in one-to-one correspondence with the pixels.

A packaging method for fabricating the optical fingerprint recognition chip package is further provided according to the present disclosure. The packaging method includes:

preparing a wafer, where the wafer includes multiple optical fingerprint recognition chips, each of the optical fingerprint recognition chips has a front surface and a back surface opposite to each other, the front surface includes a fingerprint recognition region and a peripheral region surrounding the fingerprint recognition region, the fingerprint recognition region is provided with multiple photosensitive pixels, and the peripheral region is provided with a contact pad electrically connected to the photosensitive pixels;

securing a substrate on the wafer;

forming a light shielding layer on a surface of the substrate facing away from the optical fingerprint recognition chip;

patterning the light shielding layer multiple second through holes extending through the light shielding layer;

patterning the substrate by using the patterned light shielding layer as a mask layer, to form multiple first through holes extending through the substrate, where the photosensitive pixels are exposed by the multiple first through holes, and the multiple first through holes are in one-to-one correspondence with the multiple second through holes; and cutting the wafer, the substrate and the light shielding layer by a cutting process to form multiple single packages, where the wafer is cut to obtain multiple optical fingerprint recognition chips, each of the substrate and the light shielding layer is cut to obtain multiple parts in one-to-one correspondence with the multiple optical fingerprint recognition chips.

In an embodiment, in the above packaging method, the securing the substrate on the wafer includes: attaching the substrate with the wafer, where a preset region of the front surface of each of the optical fingerprint recognition chips is secured to a preset region of the substrate, and the substrate is spaced from the optical fingerprint recognition chip by a preset interval, to adjust an image distance for pinhole imaging through a cover plate including the substrate and the light shielding layer.

In an embodiment, in the above packaging method, after forming the multiple first through holes, the method further includes: attaching glass filters on a surface of the light shielding layer facing away from the substrate, the glass filters being in one-to-one correspondence with the optical fingerprint recognition chips.

In an embodiment, in the above packaging method, a spacer is arranged between the substrate and each of the optical fingerprint recognition chips at a periphery of the optical fingerprint recognition chip, and a thickness of the spacer is equal to the preset interval.

In an embodiment, in the above packaging method, the spacer is configured to secure the substrate to the optical fingerprint recognition chip.

In an embodiment, in the above packaging method, the securing the substrate on the wafer includes: attaching glass filters on front surfaces of the optical fingerprint recognition chips, respectively, and securing the substrate on surfaces of the glass filters, where the substrate covers the glass filters, and the substrate is spaced from the optical fingerprint recognition chips by a preset interval due to a thickness of the glass filters, to adjust an image distance for pinhole imaging through a cover plate including the substrate and the light shielding layer In an embodiment, in the above packaging method, the light shielding layer is made of dry film photoresist or wet film photoresist, the multiple second through holes in one-to-one correspondence with the multiple photosensitive pixels are formed on the light shielding layer by an exposure and development process, and the substrate is a silicon substrate, and the multiple first through holes are formed on the substrate by a silicon etching process using the light shielding layer as a mask layer.

In an embodiment, in the above packaging method, a second opening is formed at a position on the light shielding layer corresponding to the contact pad by an exposure and development process while the multiple second through holes are formed, and a first opening is formed at a position on the substrate corresponding to the contact pad by an etching process on the basis of the second opening, to expose the contact pad, and the contact pad is configured to be electrically connected to a metal wire through the first opening and the second opening, so as to be electrically connected to a pad of a backplane through the metal wire.

In an embodiment, in the above packaging method, before the cutting the wafer, the substrate and the light shielding layer, the packaging method further includes:

forming a through silicon via on a surface of each of the optical fingerprint recognition chips facing away from the substrate, where the contact pad is exposed by the through silicon via, forming an insulating layer covering a sidewall of the through silicon via and the back surface of the optical fingerprint recognition chip, forming a rewiring layer covering the insulating layer, where the rewiring layer is electrically connected to the contact pad through the through silicon via and extends outside the through silicon via, and forming a solder mask covering the rewiring layer, where the solder mask is provided with an opening in a region corresponding to the back surface of each of the optical fingerprint recognition chips, the opening is configured to accommodate a solder bump for electrical connection to a pad of a backplane.

It can be known from the above description that, in the optical fingerprint recognition chip package and the packaging method for fabricating the optical fingerprint recognition chip package according to the technical solution of the present disclosure, the cover plate is arranged on the front surface of the optical fingerprint recognition chip, and the cover plate includes the substrate and the light shielding layer. The light shielding layer is arranged on a surface of the substrate facing away from the optical fingerprint recognition chip. The substrate is provided with multiple first through holes for exposing photosensitive pixels of the optical fingerprint recognition chip. The light shielding layer is provided with multiple second through holes in one-to-one correspondence with the multiple first through holes. During fingerprint recognition, light reflected by a finger may be split by the first through holes and the second through holes which are in one-to-one correspondence with the first through holes, such that the crosstalk among different photosensitive pixels is reduced, and the accuracy of the fingerprint recognition is improved.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

The technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

To make the above object, features and advantages of the present disclosure more apparent and easier to be understood, the disclosure is illustrated in detail in conjunction with the drawings and specific embodiments hereinafter.

Figure 1A:
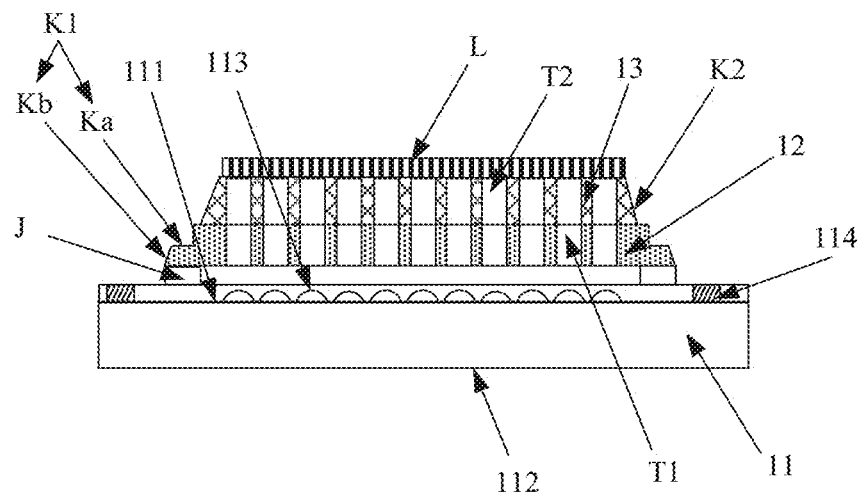
FIG. 1a is a schematic structural diagram of an optical fingerprint recognition chip package according to an embodiment of the present disclosure.

Referring to FIG. 1a, FIG. 1a is a schematic structural diagram of an optical fingerprint recognition chip package according to an embodiment of the present disclosure. The optical fingerprint recognition chip package includes an optical fingerprint recognition chip 11 and a cover plate. The optical fingerprint recognition chip 11 has a front surface 111 and a back surface 112 opposite to each other. The front surface 111 includes a fingerprint recognition region and a peripheral region surrounding the fingerprint recognition region. The fingerprint recognition region is provided with multiple photosensitive pixels 113. The peripheral region is provided with a contact pad 114 electrically connected to the photosensitive pixels 113. The cover plate is arranged opposite to the front surface 111 of the optical fingerprint recognition chip 11. The cover plate includes a substrate 12 and a light shielding layer 13. The light shielding layer 13 is arranged on a side of the substrate 12 facing away from the optical fingerprint recognition chip 11. The substrate 12 is provided with multiple first through holes T1 for exposing the photosensitive pixels 113. The light shielding layer 13 is provided with multiple second through holes T2 in one-to-one correspondence with the multiple first through holes T1.

In an embodiment, the optical fingerprint recognition chip 11 is further provided with a transparent film layer. The transparent film layer covers the front surface of the optical fingerprint recognition chip 11 for planarizing the front surface of the optical fingerprint recognition chip 11, so as to protect the photosensitive pixels 113 and facilitate securing of the optical fingerprint recognition chip 11 with other structures. The transparent film layer has a preset refractive index and may also function as an antireflection layer to increase light transmittance. The transparent film layer covers the photosensitive pixels 113. The contact pad 114 is exposed through the transparent film layer.

In the optical fingerprint recognition chip package according to the embodiment of the present disclosure, an aperture of the first through hole T1 is the same as that of the second through hole T12, or is smaller than that of the second through hole T2. A center of the first through hole T1 is aligned with a center of the second through hole T2.

The cover plate is provided with the first through holes T1 and the second through holes T2 in one-to-one correspondence the first through holes T1. The aperture of the first through holes T1 and the aperture of the second through holes T2 have the same order of magnitude as the size of the light sensing pixels 113. That is, the apertures of the first through hole T1 and the second through hole T2 are small, such that a pinhole imaging function may be realized through the cover plate with the first through holes T1 and the second through holes T2. Light reflected by a finger may be adjusted by the cover plate through the pinhole imaging function, such that the crosstalk among different photosensitive pixels 113 is reduced and the accuracy of fingerprint recognition is improved. As shown in FIG. 1a, the cover plate is spaced from the optical fingerprint recognition chip 11 by a preset interval, to adjust an image distance for pinhole imaging through the cover plate. The image distance is adjusted by adjusting the interval, such that a fingerprint image acquired through the photosensitive pixels 13 has a good quality. An appropriate interval may be set based on specific experiments or tests, so as to set an appropriate image distance. The interval is not specifically limited in the embodiment of the present disclosure.

The optical fingerprint recognition chip package further includes a glass filter L. The glass filter L is configured to remove light outside the detection light wave band, so as to reduce disturbance from the light and improve the accuracy of fingerprint recognition.

In the embodiment shown in FIG. 1a, the glass filter L is arranged on a surface of the cover plate facing away from the optical fingerprint recognition chip 11. The glass filter L covers only the photosensitive pixels 113. The contact pads 114 are exposed through the glass filter L. In this case, a spacer J with a preset thickness is arranged between a periphery of the cover plate and a periphery of the optical fingerprint recognition chip 11. The thickness of the spacer J is equal to the interval, and matches with the image distance for pinhole imaging through the cover plate. In this embodiment, the image distance for pinhole imaging through the cover plate is adjusted by setting the thickness of the spacer J, thereby facilitating adjustment of light. In this embodiment, the spacer J is configured to secure the substrate 12 to the optical fingerprint recognition chip 11.

Figure 1B:
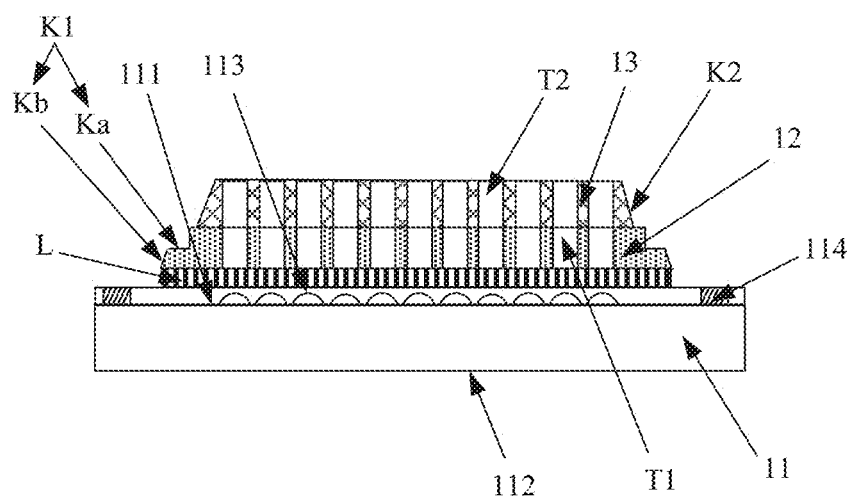
FIG. 1b is a schematic structural diagram of an optical fingerprint recognition chip package according to another embodiment of the present disclosure.

Another embodiment is as shown in FIG. 1b. FIG. 1b is a schematic structural diagram of an optical fingerprint recognition chip package according to another embodiment of the present disclosure. In this embodiment, the glass filter L is arranged between the cover plate and the optical fingerprint recognition chip 11. In this case, the thickness of the glass filter L is equal to the interval, and matches with the image distance for pinhole imaging through the cover plate. In this embodiment, the image distance for pinhole imaging through the cover plate is adjusted by setting the thickness of the glass filter L, thereby facilitating adjustment of light.

In the embodiments shown in FIG. 1a and FIG. 1b, the substrate 12 is provided with a first opening K1 at a position corresponding to the contact pad 114 to expose the contact pad 114. The light shielding layer 13 is provided with a second opening K2 at a position corresponding to the first opening K1 to expose the first opening K1. The contact pad 114 is configured to be electrically connected to a metal wire through the first opening K1 and the second opening K2, so as to be electrically connected to a pad of a backplane through the metal wire. In a case where the contact pad 114 is electrically connected to the backplane, the metal wire, the first openings K1 and the second openings K2 may be covered with a mold material layer.

In the embodiments shown in FIG. 1a and FIG. 1b, the first opening K1 includes a first groove Ka and a second groove Kb located in the first groove Ka. The contact pad 114 is exposed by the first groove Ka and the second groove Kb. A depth of the second groove Kb is less than the thickness of the substrate 12.

In an embodiment, the backplane is a PCB panel, a ceramic substrate or a glass substrate. The substrate 12 is a silicon substrate. The light shielding layer 13 is made of dry film photoresist or wet film photoresist, and the second through holes T2 may be formed by a photolithography process on the light shielding layer 13. The light shielding layer 13 may also function as a mask layer for the substrate 12 to form the first through holes T1.

In the optical fingerprint recognition chip package according to the embodiment of the present disclosure, a depth-to-width ratio of the first through hole T1 is less than or equal to 6:1. A depth-to-width ratio of the second through hole T2 is less than or equal to 6:1. A thickness of the substrate 12 is less than or equal to 200 μm. A thickness of the light shielding layer 13 is less than or equal to 200 μm. In this way, the pinhole imaging function may be realized by the cover plate with a small thickness.

In an embodiment, the substrate 12 is secured to the optical fingerprint recognition chip 11 by a die attach film (DAF). In this case, the glass filter is located on the surface of the light shielding layer 13 facing away from the optical fingerprint recognition chip 11. In a case where the glass filter is located between the substrate 12 and the optical fingerprint recognition chip 11, the glass filter may be secured to the optical fingerprint recognition chip 11 by the DAF film, and the substrate 12 is attached to a surface of the glass filter facing away from the optical fingerprint recognition chip 11.

The photosensitive pixels 113 are arranged in an array. In order to avoid the crosstalk among different photosensitive pixels 113 to a maximum degree, the first through holes T1 may be arranged in one-to-one correspondence with the photosensitive pixels 113.

In the embodiments shown in FIG. 1a and FIG. 1b, the contact pad 114 of the optical fingerprint recognition chip 11 is electrically connected to the pad of the backplane by a wire process. In other embodiments, the contact pad 114 of the optical fingerprint recognition chip 11 may be electrically connected to the pad of the backplane by the TSV (through silicon via) process. Since the through silicon via extends through the back surface of the optical fingerprint recognition chip 11, it is not required to form an opening on the cover plate for exposing the contact pad 114. Therefore, the glass filter L and the cover plate may be configured to have the same size, and cover the entire front surface of the optical fingerprint recognition chip 11. In this case, the optical fingerprint recognition chip package may be as shown in FIG. 2a to FIG. 4b.

Figure 2A:
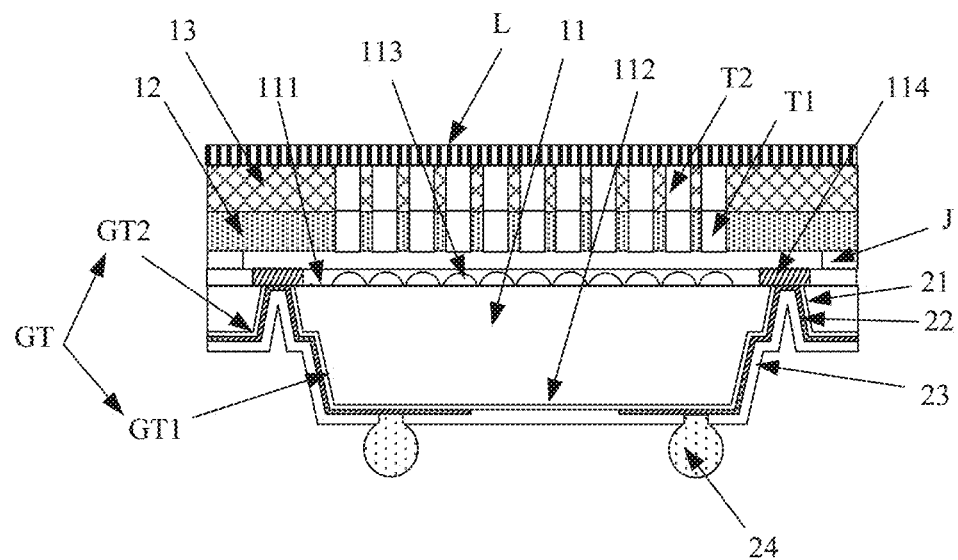
FIG. 2a is a schematic structural diagram of an optical fingerprint recognition chip package according to another embodiment of the present disclosure.

Referring to FIG. 2a, FIG. 2a is a schematic structural diagram of an optical fingerprint recognition chip package according to another embodiment of the present disclosure. In this embodiment, the optical fingerprint recognition chip 11 is provided with a through silicon via GT on the back surface at a position corresponding to the contact pad 114. The contact pad 114 is exposed by the through silicon via GT. A sidewall of the through silicon via GT and the back surface of the optical fingerprint recognition chip are covered with an insulating layer 21. A surface of the insulating layer 21 is covered with a rewiring layer 22. The rewiring layer 22 is electrically connected to the contact pad 114 through the through silicon via GT and extends outside the through silicon via GT. The rewiring layer 21 is covered with a solder mask 23, and the solder mask 23 is provided with an opening in a region corresponding to the back surface 112 of the optical fingerprint recognition chip 11 for accommodating a solder bump 24, such that the contact pad 114 is electrically connected to a pad of a backplane through the solder bump 24. The solder bump 24 is electrically connected to the rewiring layer 22 at the opening. The solder bump 24 may be a solder ball and is connected to the contact pad by welding. In this embodiment, an adhesive layer is further arranged between the optical fingerprint recognition chip 11 and the backplane to secure the optical fingerprint recognition chip 11 to the backplane.

In the embodiment shown in FIG. 2a, the optical fingerprint recognition chip 11 is electrically connected to the backplane by a through silicon via (TSV) process. In this embodiment, the through silicon via GT is a stepped through hole having two steps. The stepped through hole includes a groove GT1 located on the back surface 112 of the optical fingerprint recognition chip 11 and a through hole GT2 located in the groove GT1. A depth of the groove GT1 is less than the thickness of the optical fingerprint recognition chip 11. The through hole GT2 extends through the optical fingerprint recognition chip 11, to expose the contact pad 114. The groove GT1 corresponding to multiple through holes GT2 on the same side of the optical fingerprint recognition chip 11 may be formed into an integral structure.

In the embodiment shown in FIG. 2a, the glass filter L is located on a surface of the cover plate facing away from the optical fingerprint recognition chip 11. In this case, a spacer J is arranged between the cover plate and the optical fingerprint recognition chip 11. The image distance for pinhole imaging through the cover plate is adjusted by setting the thickness of the spacer J. In this embodiment, a stepped through silicon via having two steps is used.

Figure 2B:
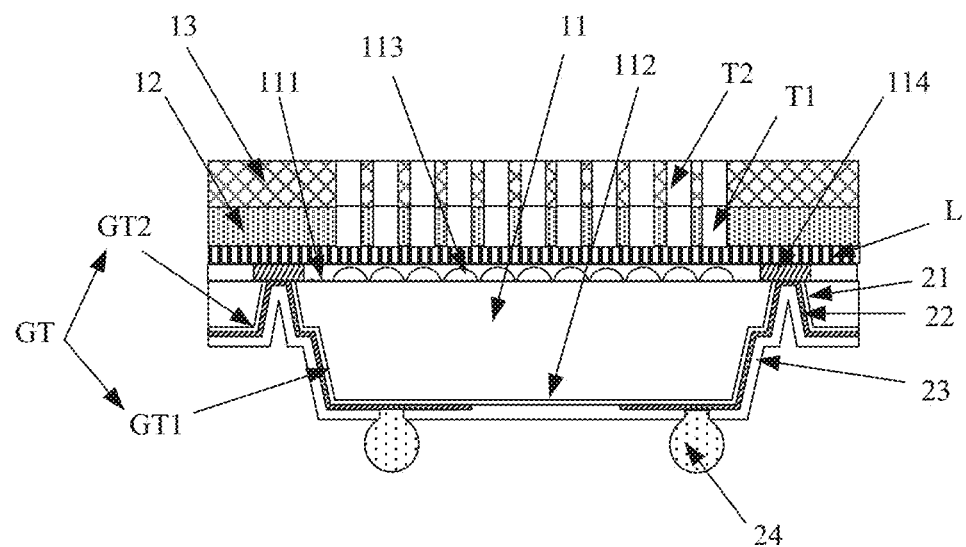
FIG. 2b is a schematic structural diagram of an optical fingerprint recognition chip package according to another embodiment of the present disclosure.

In a case where the contact pad 114 of the optical fingerprint recognition chip 11 is electrically connected to the pad of the backplane through the stepped through silicon via having two steps, the optical fingerprint recognition chip package may also be as shown in FIG. 2b. FIG. 2b is a schematic structural diagram of an optical fingerprint recognition chip package according to another embodiment of the present disclosure. FIG. 2b is different from FIG. 2a in that the glass filter L is arranged between the cover plate and the optical fingerprint recognition chip 11, and the image distance for pinhole imaging through the cover plate is adjusted by setting the thickness of the glass filter L.

Figure 3A:
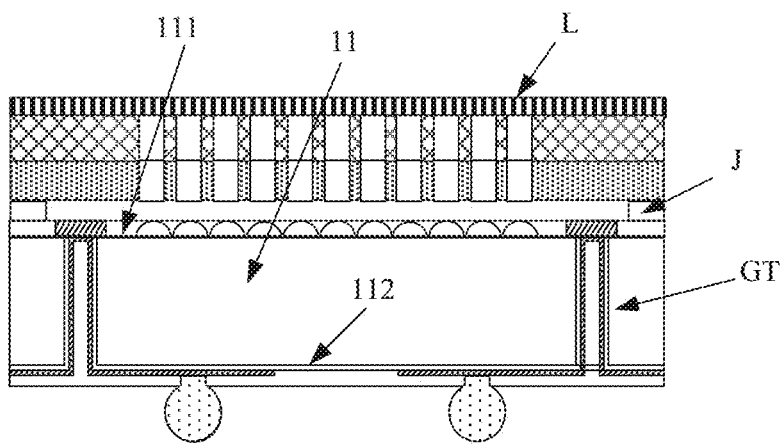
FIG. 3a schematic structural diagram of an optical fingerprint recognition chip package according to another embodiment of the present disclosure.

In a case where the optical fingerprint recognition chip 11 is electrically connected to the backplane by the TSV process, the through silicon via GT may also be a straight hole as shown in FIG. 3a. FIG. 3a is a schematic structural diagram of an optical fingerprint recognition chip pkkage according to another embodiment of the present disclosure. A width of the straight hole in a first direction remains constant. The first direction is perpendicular to the optical fingerprint recognition chip 11, and is from the front surface 111 of the optical fingerprint recognition chip 11 toward the back surface 112 of the optical fingerprint recognition chip 11. In this embodiment, the glass filter is located on the surface of the cover plate facing away from the optical fingerprint recognition chip 11. In this case, a spacer J is arranged between the cover plate and the optical fingerprint recognition chip 11.

Figure 3B:
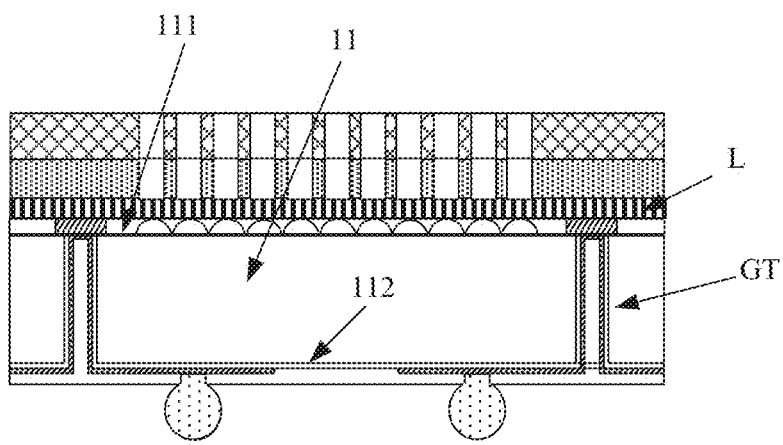
FIG. 3b schematic structural diagram of an optical fingerprint recognition chip package according to another embodiment of the present disclosure.

In a case where the through silicon via GT is a straight hole, as shown in FIG. 3b, which is a schematic structural diagram of an optical fingerprint recognition chip package according to another embodiment of the present disclosure, the glass filter may also be arranged between the cover plate and the optical fingerprint recognition chip 11.

Figure 4A:
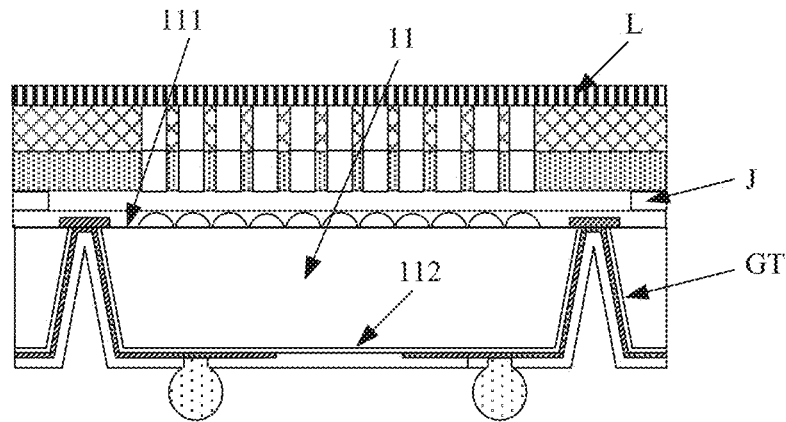
FIG. 4a schematic structural diagram of an optical fingerprint recognition chip package according to another embodiment of the present disclosure.

In a case where the optical fingerprint recognition chip 11 is electrically connected to the backplane by the TSV process, the through silicon via GT may also be a trapezoid hole as shown in FIG. 4a. FIG. 4a is a schematic structural diagram of an optical fingerprint recognition chip package according to another embodiment of the present disclosure. A width of the trapezoid hole increases gradually in a first direction. The first direction is perpendicular to the optical fingerprint recognition chip 11, and is from the front surface 111 of the optical fingerprint recognition chip 11 toward the back surface 112 of the optical fingerprint recognition chip 11. In this embodiment, the glass filter is located on the surface of the cover plate facing away from the optical fingerprint recognition chip 11. In this case, a spacer J is arranged between the cover plate and the optical fingerprint recognition chip 11.

Figure 4B:
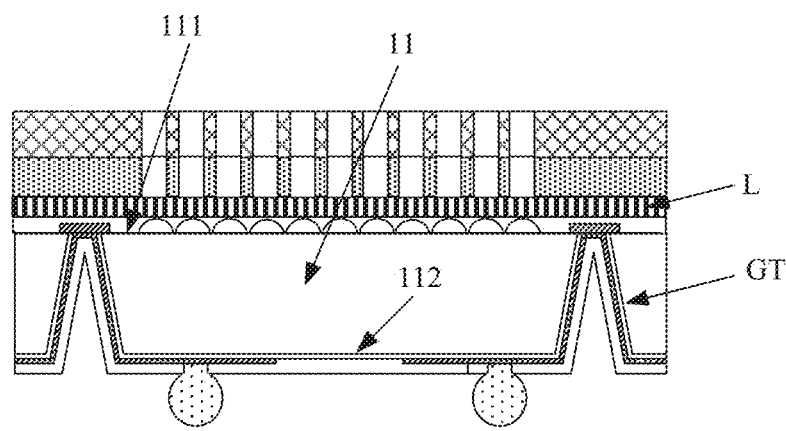
FIG. 4b schematic structural diagram of an optical fingerprint recognition chip package according to another embodiment of the present disclosure.

In a case where the through silicon via GT is a trapezoid hole, as shown in FIG. 4b, which is a schematic structural diagram of an optical fingerprint recognition chip package according to another embodiment of the present disclosure, the glass filter may also be arranged between the cover plate and the optical fingerprint recognition chip 11.

In the optical fingerprint recognition chip package according to the embodiment of the present disclosure, the contact pad 114 may be exposed by an opening arranged on a front surface of the cover plate to facilitate the electrical connection to an external circuit, as shown in FIG. 1a and FIG. 1b. Alternatively, an interconnection structure may be arranged on the back surface of the optical fingerprint recognition chip 11, for electrical connection to an external circuit. The interconnection structure includes an interconnection layer. The interconnection layer includes the insulating layer 21, the rewiring layer 22 and the solder mask 23.

It can be seen from the above description that in the optical fingerprint recognition chip package according to the embodiment of the present disclosure, the substrate 12 provided with the first through holes T1 is arranged on the front surface 111 of the optical fingerprint recognition chip 11, and the light shielding layer 13 is arranged on a surface of the substrate 12 facing away from the optical fingerprint recognition chip 11. The light shielding layer 13 is provided with second through holes T2 in one-to-one correspondence with the first through holes T1. With the first through holes T1 and the second through holes T2, the light reflected at a specific angle may travel through the cover plate, and enters the fingerprint recognition region, such that the light path is controlled and the crosstalk is avoided. The first through holes T1 may be in one-to-one correspondence with the photosensitive pixels 113, or one first through hole T1 may correspond to multiple photosensitive pixels 113.

During fingerprint recognition, the light reflected by the finger may be split by the first through holes T1 and the second through holes T2 in one-to-one correspondence the first through holes T1 so as to reduce the crosstalk among different photosensitive pixels, and improve the accuracy of fingerprint recognition.

Based on the above embodiments of the optical fingerprint recognition chip package, a packaging method is further provided according to another embodiment of the present disclosure. The packaging method is used for packaging an optical fingerprint recognition chip to form the optical fingerprint recognition chip package described in the above embodiments. The packaging method is shown in FIG. 5a to FIG. 10, which show a procedure of a packaging method according to an embodiment of the present disclosure. The packaging method includes the following steps S11 to S16.

Figure 5A:
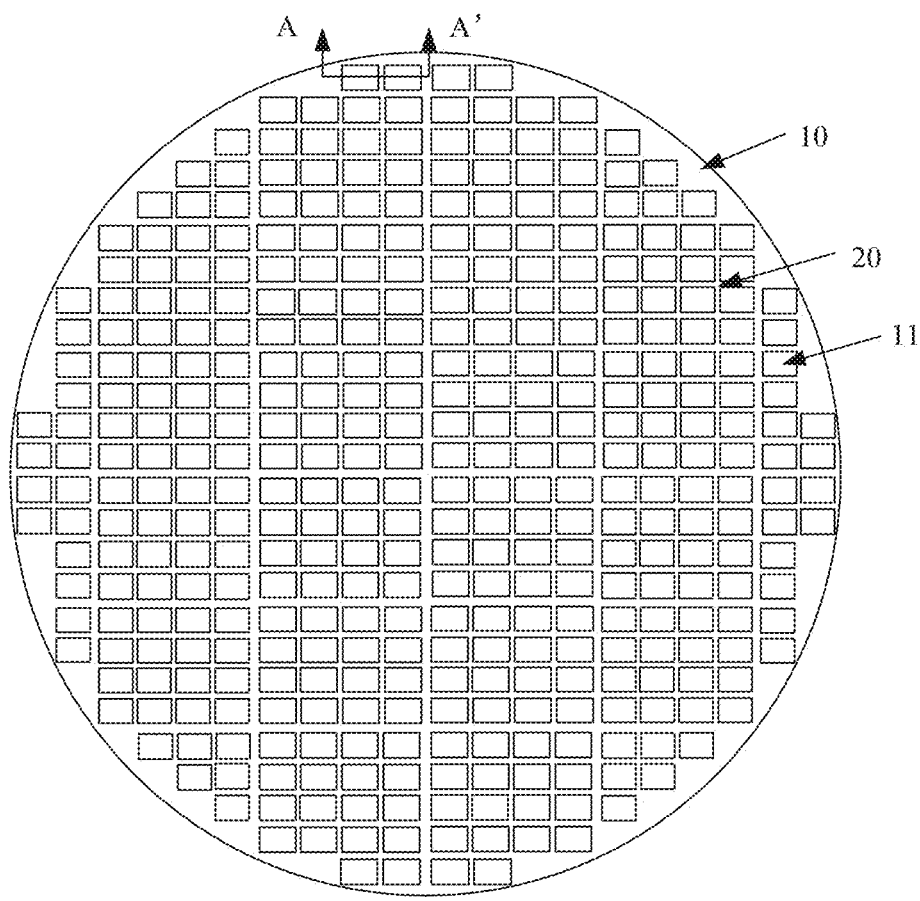
FIG. 5a to FIG. 10 are schematic diagrams showing a procedure of a packaging method according to an embodiment of the present disclosure.
Figure 5B:
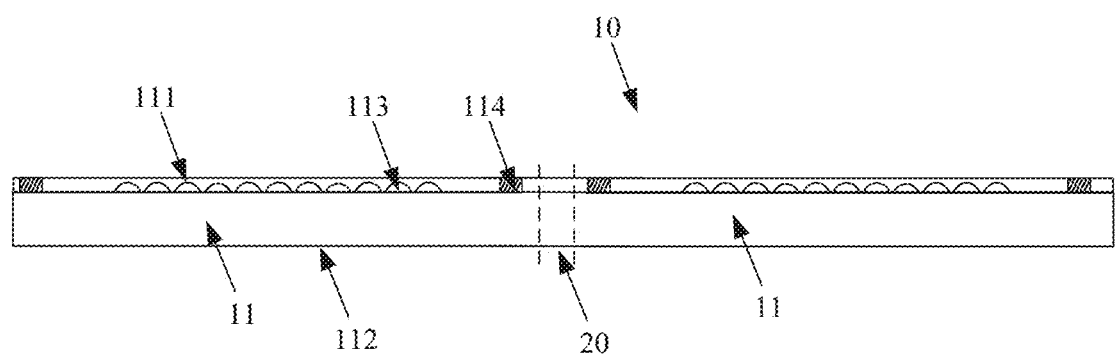

In step S11, as shown in FIG. 5a and FIG. 5b, a wafer 10 is prepared.

FIG. 5a is a top view of the wafer 10 corresponding to the front surface of the optical fingerprint recognition chip, and FIG. 5b is a cross-sectional view of the wafer shown in FIG. 5a taken along A-A'. The wafer 10 includes multiple optical fingerprint recognition chips 11. Each of the optical fingerprint recognition chips 11 has a front surface 111 and a back surface 112 opposite to each other. The front surface 111 includes a fingerprint recognition region and a peripheral region surrounding the fingerprint recognition region. The fingerprint recognition region is provided with multiple photosensitive pixels 113. The peripheral region is provided with a contact pad 114 electrically connected to the photosensitive pixels 113. A cutting trench 20 is provided between adjacent optical fingerprint recognition chips 11.

Figure 6:
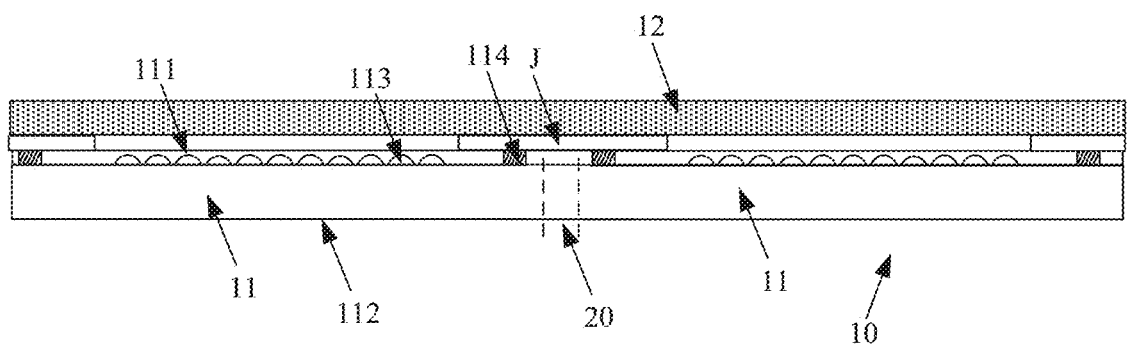

In step S12, as shown in FIG. 6, a substrate 12 is secured to the wafer 10.

In this step, the substrate 12 is secured to the wafer 10 in the following manner. The substrate 12 is attached with the wafer 10. A preset region of the front surface of each of the optical fingerprint recognition chips 11 is secured to a preset region of the substrate 12, such that in each of the packages obtained by the cutting process, the optical fingerprint recognition chip 11 is secured to a cover plate obtained by cutting the substrate 12 corresponding to the optical fingerprint recognition chip 11. The substrate 12 is spaced from the optical fingerprint recognition chip 11 by a preset interval to adjust the image distance for pinhole imaging through the cover plate. The cover plate includes the substrate and a light shielding layer described below.

In this embodiment, the substrate 12 is directly secured to the front surface of each of the optical fingerprint recognition chips 11 by a spacer J at the periphery of the front surface of the optical fingerprint recognition chips 11. The spacer is arranged between the optical fingerprint recognition chip 11 and the substrate 12 at the periphery of the optical fingerprint recognition chips 11. A thickness of the spacer matches with the image distance for pinhole imaging through the cover plate. In this embodiment, as shown in FIG. 6, the cover plate is directly secured to the front surface of each of the optical fingerprint recognition chips 11 at the periphery of the front surface.

In an embodiment, the substrate 12 is a silicon substrate. In a subsequent step, first through holes T1 are formed on the substrate 12 by a silicon etching process using the light shielding layer 13 as a mask layer.

Figure 7:
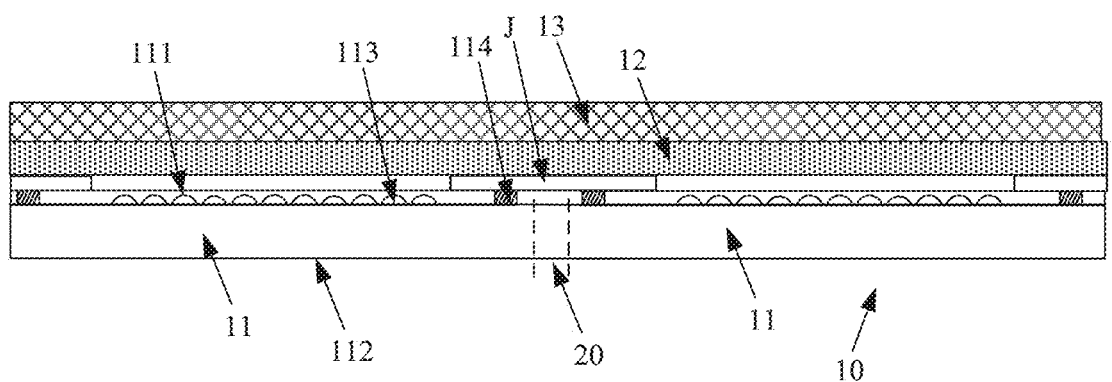

In step S13, as shown in FIG. 7, a light shielding layer 13 is formed on a surface of the substrate 12 facing away from the optical fingerprint recognition chip 11.

In an embodiment, the light shielding layer 13 is made of dry film photoresist or wet film photoresist, to facilitate formation of the second through holes T2 on the light shielding layer 13 which are in one-to-one correspondence with the photosensitive pixels 113 by an exposure and development process in a subsequent step.

Figure 8:
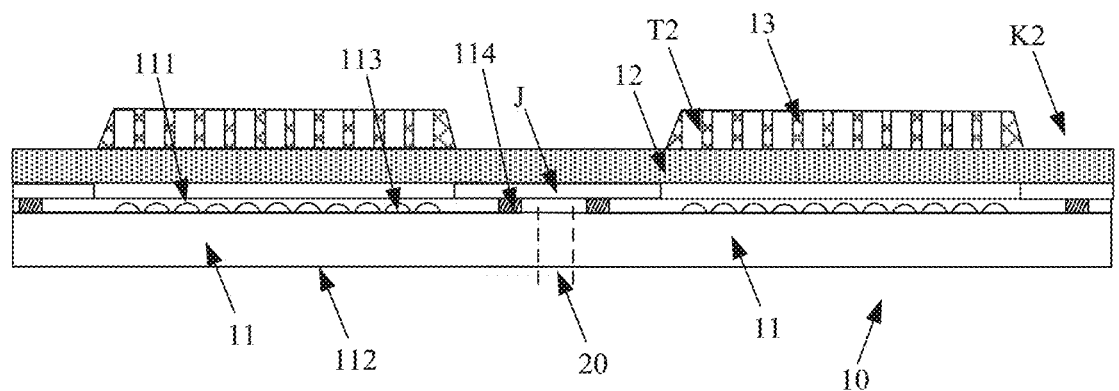

In step S14, as shown in FIG. 8, the light shielding layer 13 is patterned to form multiple second through holes T2 extending through the light shielding layer 13.

Figure 9:
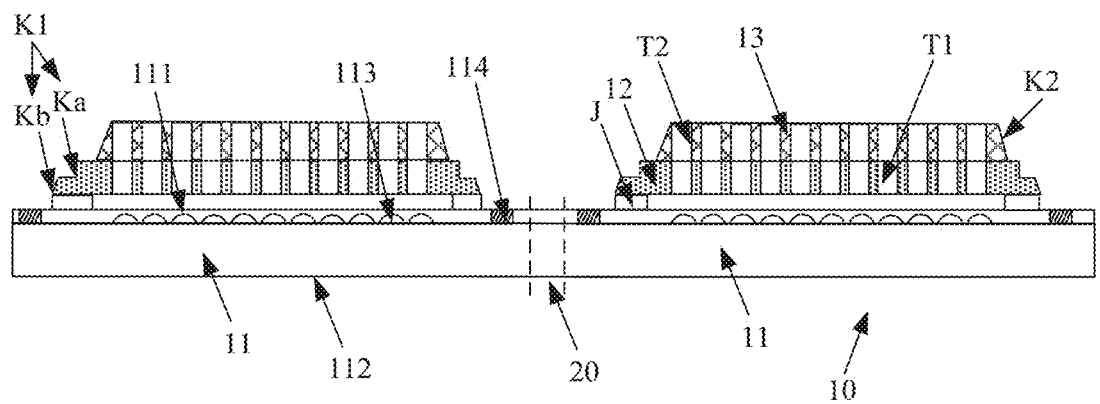

In step S15, as shown in FIG. 9, the substrate 12 is patterned by using the patterned light shielding layer 13 as a mask layer, to form the first through holes T1 extending through the substrate 12.

The first through holes T1 are configured to expose the photosensitive pixels 113, and the first through holes T1 are in one-to-one correspondence with the second through holes T2.

Figure 10:
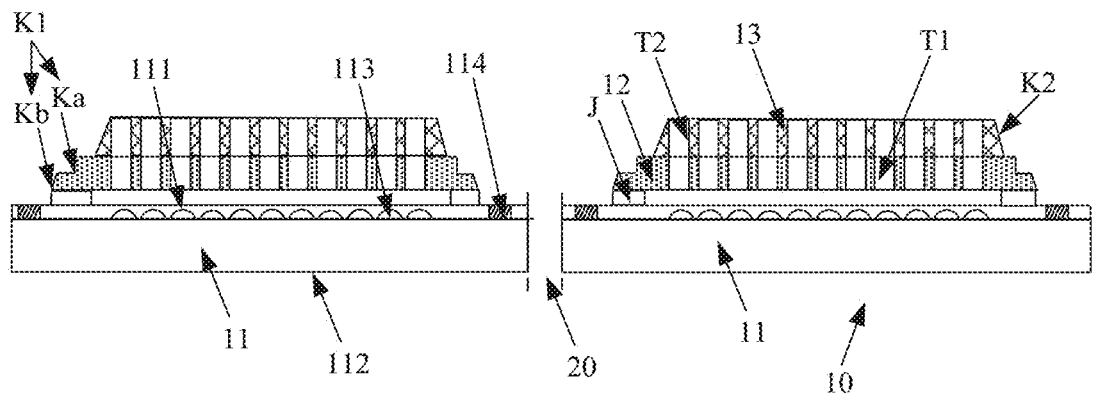

In step S16, as shown in FIG. 10, the wafer 10, the substrate 12 and the light shielding layer 13 are cut by a cutting process to form multiple single packages.

The wafer 10 is cut to obtain multiple optical fingerprint recognition chips 11. Each of the substrate 12 and the light shielding layer 13 is cut to obtain multiple parts in one-to-one correspondence with the optical fingerprint recognition chips 11.

After the first through holes T1 are formed, the packaging method further includes: attaching glass filters L on a surface of the light shielding layer 13 facing away from the substrate 12. The formed package is as shown in FIG. 1a. The glass filters L are in one-to-one correspondence with the optical fingerprint recognition chips. In this case, the glass filters L may be attached to regions respectively corresponding to the optical fingerprint recognition chips 11 before the cutting process is performed, or the glass filter L may be attached to a region corresponding to the optical fingerprint recognition chip 11 after the cutting process is performed.

In the packaging method shown in FIGS. 5a to 10, a spacer J is arranged between the substrate 12 and the optical fingerprint recognition chip 11 at the periphery of the optical fingerprint recognition chip 11, and the thickness of the spacer J is equal to the interval. The spacer J is configured to secure the substrate 12 to the optical fingerprint recognition chip 11.

In the packaging method according to the embodiment of the present disclosure, the light shielding layer 13 is made of dry film photoresist dry film or wet film photoresist, and the second through holes T2 in one-to-one correspondence with the photosensitive pixels 113 are formed on the light shielding layer 13 by an exposure and development process. The substrate 12 is a silicon substrate. The first through holes T1 are formed on the substrate 12 by a silicon etching process using the light shielding layer 13 as a mask layer.

In the packaging method shown in FIGS. 5a to 10, a second opening K2 is formed at a position on the light shielding layer 13 corresponding to the contact pad 114 by an exposure and development process while the second through holes T2 are formed. On the basis of the second opening K2, a first opening K1 is formed at a position on the substrate corresponding to the contact pad 114 by an etching process, to expose the contact pad 114. The contact pad 114 is configured to be electrically connected to a metal wire through the first opening K1 and the second opening K2, so as to be electrically connected to a pad of a backplane through the metal wire. The first opening includes a first groove Ka and a second groove Kb located in the first groove Ka. The first opening K1 may be formed while the first through hole T1 is formed.

In other embodiments, the glass filters L may be respectively attached to the optical fingerprint recognition chips 11 before the substrate 12 is secured on the wafer 10. In this case, the securing the substrate 12 on the wafer 10 includes: attaching glass filters L on front surfaces 111 of the optical fingerprint recognition chips 11 respectively, and securing the substrate 12 on surfaces of the glass filters L. The substrate 12 covers all of the glass filters L. The substrate 12 is spaced from the optical fingerprint recognition chip 11 by a preset interval due to the thickness of the glass filter L, to adjust the image distance for pinhole imaging through the cover plate. Similarly, the cover plate includes the substrate 12 and the light shielding layer 13, and the formed package is as shown in FIG. 1b.

In the packaging method according to the embodiment of the present disclosure, the substrate 12 provided with the first through holes T1 and the light shielding layer 13 provided with the second through holes T2 are arranged on the front surface 111 of the optical fingerprint recognition chip, such that the crosstalk among different photosensitive pixels 113 can be effectively avoided, and the accuracy of fingerprint recognition is improved. In this case, the light shielding layer 13 may also be used as a mask layer for the substrate 12, such that the process flow is simplified and the manufacturing cost is reduced.

The packaging method further includes: arranging a backplane on a side of the optical fingerprint recognition chip facing away from the substrate. The backplane includes a metal circuit layer and a pad electrically connected to the metal circuit layer. The contact pad 114 is electrically connected to the pad of the backplane, so as to be electrically connected to an external circuit through the backplane. The optical fingerprint recognition chip may be electrically connected to the backplane through a wire.

In other embodiments, an interconnection structure may be formed on the back surface of the package by a TSV process, thereby facilitating electrical connection to the backplane, thus realizing electrical connection to an external circuit through the backplane. The formed package is as shown in FIG. 2a to FIG. 4b.

The packages as shown in FIGS. 2a to 4a are fabricated by a packaging method shown in FIGS. 11 to 14. After the first through holes T1 and the second through holes T2 are formed, the method further includes the following steps S21 to S24.

Figure 11:
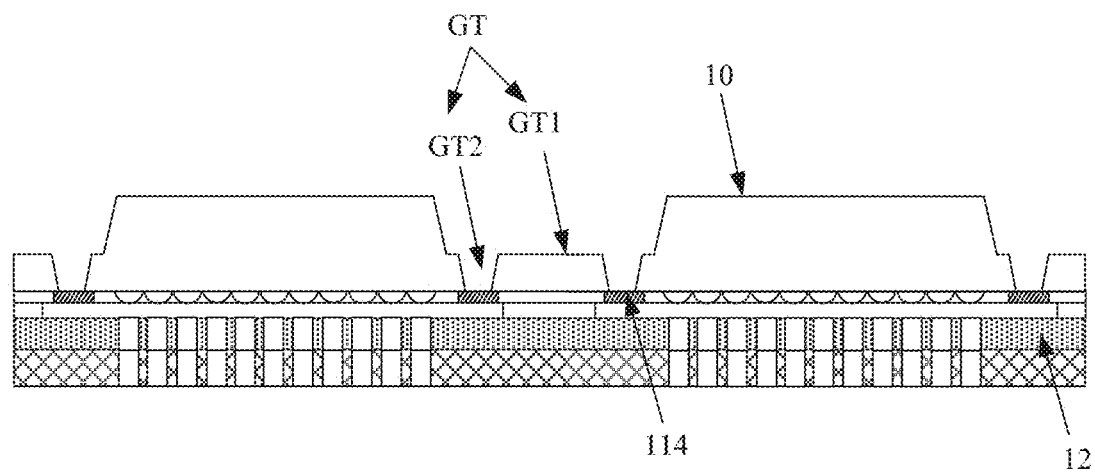
FIG. 11 to FIG. 14 are schematic diagrams showing a procedure of a packaging method according to another embodiment of the present disclosure.

In step S21, as shown in FIG. 11, before the cutting process is performed, a through silicon via GT is formed on a surface of each of the optical fingerprint recognition chips 11 facing away from the substrate 12. The contact pad 114 is exposed by the through silicon via GT.

In this step, the wafer 10 is inverted, such that the cover plate faces downward, thereby facilitating the formation of the through silicon via GT. In FIG. 11, a stepped through hole including two steps is shown as an example. The stepped through hole includes a groove GT1 located on the back surface 112 of the optical fingerprint recognition chip 11 and a through hole GT2 located in the groove GT1.

Figure 12:
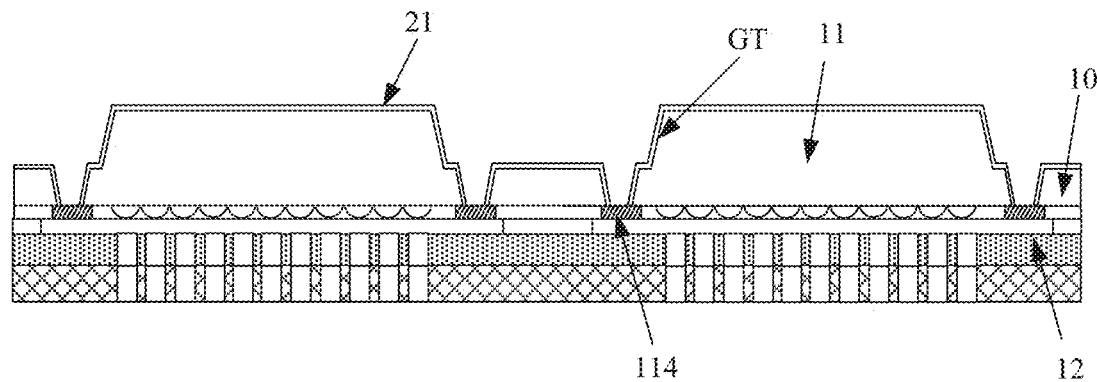

In step S22, as shown in FIG. 12, an insulating layer 21 covering a sidewall of the through silicon via GT and the back surface of the optical fingerprint recognition chip 11 is formed.

Figure 13:
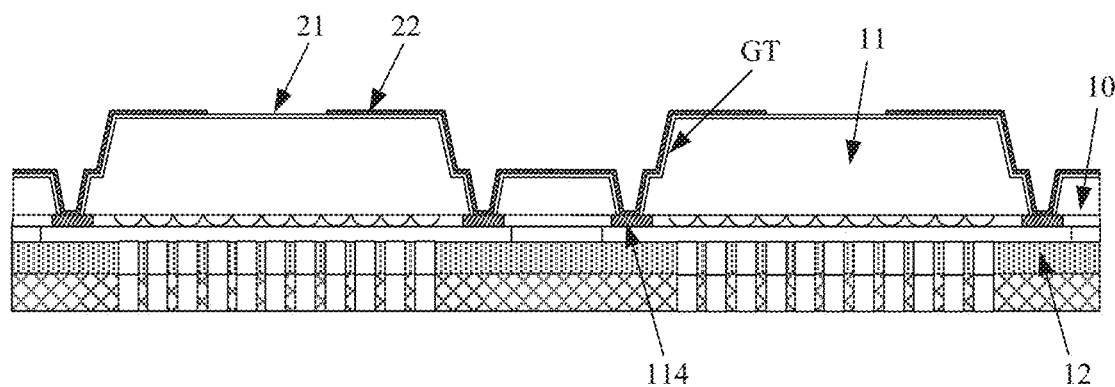

In step S23, as shown in FIG. 13, a rewiring layer 22 covering the insulating layer 21 is formed. The rewiring layer 22 is electrically connected to the contact pad 114 through the through silicon via GT and extends outside the through silicon via GT.

Figure 14:
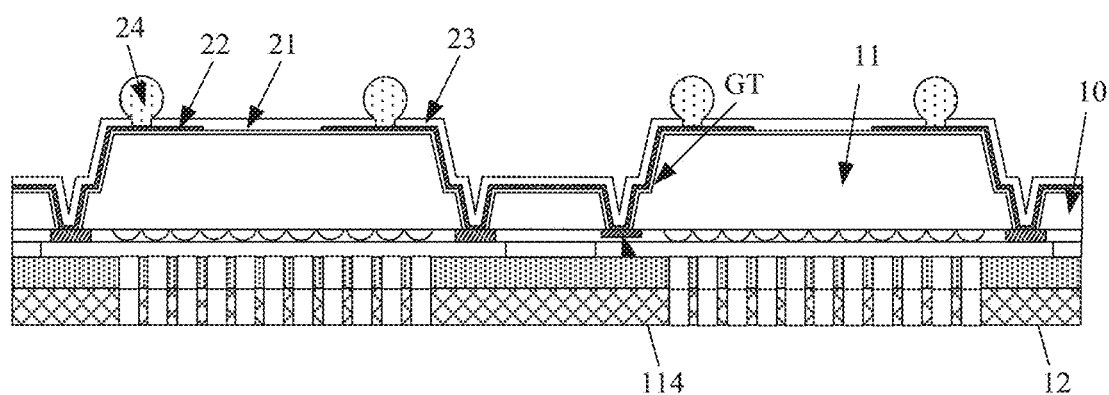

In step S24, as shown in FIG. 14, a solder mask 23 covering the rewiring layer 22 is formed. The solder mask 23 is provided with an opening in a region opposite to the back surface of each of the optical fingerprint recognition chips 11 to accommodate a solder bump 24. The solder bump 24 is configured to be electrically connected to a pad of a backplane.

After the back surface interconnection structure is formed on the back surface of the wafer, first, the back surface interconnection structure of the wafer is precut to partition the interconnect layer (including the insulating layer, the rewiring layer and the solder mask). The pre-cutting process may be performed by laser along a cutting trench. After the pre-cutting process is performed, the backplane and the wafer are cut by a cutter. Since the interconnect layer is made of a material which is relatively brittle and has low ductility and toughness, the back surface interconnection structure is pre-cut by laser, to reduce damage to the interconnection layer, thereby avoiding cracking or faults of the interconnection layer, thus ensuring the reliability of the chip. The wafer, the substrate and the light shielding layer are respectively made of materials with the same or similar hardness and may be cut using the same cutter along a mark pre-formed by laser, while ensuring the flatness of the cutting end face and avoiding damage to the end face.

After the cutting process is performed, the glass filter L is attached, and the formed package is as shown in FIG. 2a. The differences between the packages shown in FIG. 2b to FIG. 4b are that the through silicon vias GT have different shapes and the glass filter is located at different positions. For the formation process, reference may be made to the above description and is not repeated here.

The optical fingerprint recognition chip package described in the above embodiments can be fabricated with the packaging method according to the embodiments of the present disclosure with simple processes at a low manufacturing cost. With the formed optical fingerprint recognition chip package, the crosstalk between different photosensitive pixels can be avoided, and the accuracy of fingerprint recognition is improved.

The above embodiments are described in a progressive manner. Each of the embodiments is mainly focused on describing its differences from other embodiments, and references may be made among these embodiments with respect to the same or similar parts. For the packaging method disclosed in the embodiment, since the packaging method corresponds to the optical fingerprint recognition chip package disclosed in the embodiments, the packaging method is described simply. For the relevant part, reference may be made to the corresponding part of the optical fingerprint recognition chip package.

The above illustration of the disclosed embodiments enables those skilled in the art to implement or practice the present disclosure. Various modifications to the embodiments are apparent to the person skilled in the art, and the general principle herein can be implemented in other embodiments without departing from the spirit or scope of the present disclosure. Therefore, the present disclosure is not limited to the embodiments described herein, but should be in accordance with the broadest scope consistent with the principle and novel features disclosed herein.

The invention claimed is:

1. An optical fingerprint recognition chip package, comprising:
   an optical fingerprint recognition chip having a front surface and a back surface opposite to each other, wherein the front surface comprises a fingerprint recognition region and a peripheral region surrounding the fingerprint recognition region, the fingerprint recognition region is provided with a plurality of photosensitive pixels, and the peripheral region is provided with a contact pad electrically connected to the photosensitive pixels; and
   a cover plate arranged opposite to the front surface of the optical fingerprint recognition chip and comprising a substrate and a light shielding layer, wherein
   the light shielding layer is located on a side of the substrate facing away from the optical fingerprint recognition chip, the substrate is provided with a plurality of first through holes for exposing the photosensitive pixels, and the light shielding layer is provided with a plurality of second through holes in one-to-one correspondence with the plurality of first through holes.

2. The optical fingerprint recognition chip package according to claim 1, wherein the cover plate is spaced from the optical fingerprint recognition chip by a preset interval, to adjust an image distance for pinhole imaging through the cover plate.

3. The optical fingerprint recognition chip package according to claim 1, wherein a glass filter is arranged between the cover plate and the optical fingerprint recognition chip, to remove light outside a detection light wave band.

4. The optical fingerprint recognition chip package according to claim 1, wherein a glass filter is arranged on a surface of the cover plate facing away from the optical fingerprint recognition chip, to remove light outside a detection light wave band.

5. The optical fingerprint recognition chip package according to claim 1, wherein a spacer with a preset thickness is arranged between a periphery of the cover plate and a periphery of the optical fingerprint recognition chip.

6. The optical fingerprint recognition chip package according to claim 1, wherein
the substrate is provided with a first opening at a position corresponding to the contact pad, to expose the contact pad,
the light shielding layer is provided with a second opening at a position corresponding to the first opening, to expose the first opening, and
the contact pad is configured to be electrically connected to a metal wire through the first opening and the second opening, so as to be electrically connected to a pad of a backplane through the metal wire.

7. The optical fingerprint recognition chip package according to claim 6, wherein the first opening comprises a first groove and a second groove located in the first groove, and the contact pad is exposed by the first groove and the second groove.

8. The optical fingerprint recognition chip package according to claim 1, wherein
the optical fingerprint recognition chip is provided with a through silicon via at a position on the back surface corresponding to the contact pad, and the contact pad is exposed by the through silicon via,
a sidewall of the through silicon via and the back surface of the optical fingerprint recognition chip are covered with an insulating layer,
a surface of the insulating layer is covered with a rewiring layer, and the rewiring layer is electrically connected to the contact pad through the through silicon via and extends outside the through silicon via, and
the rewiring layer is covered with a solder mask, the solder mask is provided with an opening in a region corresponding to the back surface of the optical fingerprint recognition chip, and the opening is configured to accommodate a solder bump for electrical connection to a pad of a backplane.

9. The optical fingerprint recognition chip package according to claim 1, wherein the substrate is a silicon substrate, and the light shielding layer is made of dry film photoresist or wet film photoresist.

10. The optical fingerprint recognition chip package according to claim 1, wherein a depth-to-width ratio of the first through hole is less than or equal to than 6:1, and a depth-to-width ratio of the second through hole is less than or equal to 6:1.

11. The optical fingerprint recognition chip package according to claim 1, wherein a thickness of the substrate is less than or equal to 200 µm, and a thickness of the light shielding layer is less than or equal to 200 µm.

12. The optical fingerprint recognition chip package according to claim 1, wherein the photosensitive pixels are arranged in an array, and the first through holes are in one-to-one correspondence with the pixels.

13. A packaging method for fabricating the optical fingerprint recognition chip package according to claim 1, comprising:
preparing a wafer, wherein the wafer comprises a plurality of optical fingerprint recognition chips, each of the optical fingerprint recognition chips has a front surface and a back surface opposite to each other, the front surface comprises a fingerprint recognition region and a peripheral region surrounding the fingerprint recognition region, the fingerprint recognition region is provided with a plurality of photosensitive pixels, and the peripheral region is provided with a contact pad electrically connected to the photosensitive pixels;
securing a substrate on the wafer;
forming a light shielding layer on a surface of the substrate facing away from the optical fingerprint recognition chip;
patterning the light shielding layer to form a plurality of second through holes extending through the light shielding layer;
patterning the substrate by using the patterned light shielding layer as a mask layer, to form a plurality of first through holes extending through the substrate, wherein the photosensitive pixels are exposed by the plurality of first through holes, and the plurality of first through holes are in one-to-one correspondence with the plurality of second through holes; and
cutting the wafer, the substrate and the light shielding layer by a cutting process to form a plurality of single packages,
wherein the wafer is cut to obtain a plurality of optical fingerprint recognition chips, each of the substrate and the light shielding layer is cut to obtain a plurality of parts in one-to-one correspondence with the plurality of optical fingerprint recognition chips.

14. The packaging method according to claim 13, wherein the securing the substrate on the wafer comprises:
attaching the substrate with the wafer, wherein
a preset region of the front surface of each of the optical fingerprint recognition chips is secured to a preset region of the substrate, and
the substrate is spaced from the optical fingerprint recognition chip by a preset interval, to adjust an image distance for pinhole imaging through a cover plate comprising the substrate and the light shielding layer.

15. The packaging method according to claim 14, wherein after forming the plurality of first through holes, the method further comprises:
attaching glass filters on a surface of the light shielding layer facing away from the substrate, the glass filters being in one-to-one correspondence with the optical fingerprint recognition chips.

16. The packaging method according to claim 15, wherein a spacer is arranged between the substrate and each of the optical fingerprint recognition chips at a periphery of the optical fingerprint recognition chip, a thickness of the spacer is equal to the preset interval, and the spacer is configured to secure the substrate to the optical fingerprint recognition chip.

17. The packaging method according to claim 13, wherein the securing the substrate on the wafer comprises:
attaching glass filters on front surfaces of the optical fingerprint recognition chips, respectively, and
securing the substrate on surfaces of the glass filters, wherein the substrate covers the glass filters, and
the substrate is spaced from the optical fingerprint recognition chips by a preset interval due to a thickness of the glass filters, to adjust an image distance for pinhole imaging through a cover plate comprising the substrate and the light shielding layer.

18. The packaging method according to claim 13, wherein the light shielding layer is made of dry film photoresist or wet film photoresist, the plurality of second through holes in one-to-one correspondence with the plurality of photosensitive pixels are formed on the light shielding layer by an exposure and development process, and the substrate is a silicon substrate, and the plurality of first through holes are formed on the substrate by a silicon etching process using the light shielding layer as a mask layer.

19. The packaging method according to claim 18, wherein a second opening is formed at a position on the light shielding layer corresponding to the contact pad by an exposure and development process while the plurality of second through holes are formed, and a first opening is formed at a position on the substrate corresponding to the contact pad by an etching process on the basis of the second opening, to expose the contact pad, and the contact pad is configured to be electrically connected to a metal wire through the first opening and the second opening, so as to be electrically connected to a pad of a backplane through the metal wire.

20. The packaging method according to claim 13, wherein before the cutting the wafer, the substrate and the light shielding layer, the packaging method further comprises:

forming a through silicon via on a surface of each of the optical fingerprint recognition chips facing away from the substrate, wherein the contact pad is exposed by the through silicon via, forming an insulating layer covering a sidewall of the through silicon via and the back surface of the optical fingerprint recognition chip, forming a rewiring layer covering the insulating layer, wherein the rewiring layer is electrically connected to the contact pad through the through silicon via and extends outside the through silicon via, and forming a solder mask covering the rewiring layer, wherein the solder mask is provided with an opening in a region corresponding to the back surface of each of the optical fingerprint recognition chips, the opening is configured to accommodate a solder bump for electrical connection to a pad of a backplane.

* * * * *